(12) United States Patent
Ly

(10) Patent No.: US 6,545,487 B1
(45) Date of Patent: Apr. 8, 2003

(54) SYSTEM AND METHOD FOR PRODUCING AN AMPLIFIED SIGNAL WITH REDUCED DISTORTION

(75) Inventor: Trung Ly, North Plainfield, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/645,120

(22) Filed: Aug. 24, 2000

(51) Int. Cl.[7] .................... G01R 23/20; H03F 1/26; H04B 1/10; H04B 7/01
(52) U.S. Cl. .................. 324/620; 324/622; 330/149; 455/295; 455/232.1
(58) Field of Search .................. 324/620, 613, 324/622, 76.79, 76.44, 76.45; 330/151, 152, 149, 147; 455/296, 295, 232.1, 501

(56) References Cited

U.S. PATENT DOCUMENTS

| | | | | |
|---|---|---|---|---|
| 3,794,935 A | * | 2/1974 | Tsuchiya et al. | 330/151 |
| 5,166,634 A | * | 11/1992 | Narahashi et al. | 330/151 |
| 5,334,946 A | * | 8/1994 | Kenington et al. | 330/144 |
| 5,489,875 A | * | 2/1996 | Cavers | 330/149 |
| 5,847,603 A | * | 12/1998 | Myer | 330/151 |
| 5,898,339 A | * | 4/1999 | Maruyama et al. | 330/149 |
| 6,104,241 A | * | 8/2000 | Cova et al. | 330/149 |
| 6,140,874 A | * | 10/2000 | French et al. | 327/359 |

FOREIGN PATENT DOCUMENTS

DE  197 20 019 A  5/1998  ............. H03F/1/32

OTHER PUBLICATIONS

European Search Report dated Sep. 11, 2001 for European Patent Application 01301960.9.

* cited by examiner

Primary Examiner—N. Le
Assistant Examiner—Anjan K. Deb

(57) ABSTRACT

A distortion reduction system uses upstream signal information from carrier frequencies in a signal to be amplified, to determine at least one frequency for the distortion generated by an amplifier amplifying the signal. A sample of an output is taken, and a distortion detection circuitry is used to detect the amplitude of the distortion at least at the one frequency. In response to the amplitude of the distortion at the one frequency, the processing circuitry provides gain and/or phase control signal(s) to adjust the relative phase and/or gain between combining distortion products to reduce the amplitude of the distortion.

12 Claims, 7 Drawing Sheets

SYSTEM AND METHOD FOR PRODUCING AN AMPLIFIED SIGNAL WITH REDUCED DISTORTION

BACKGROUND OF THE INVENTION

1. Field of The Invention

This invention relates to a signal amplification system producing an amplified signal with reduced distortion.

2. Description of Related Art

Amplifiers often add undesired distortion to a signal, creating an output signal comprising distortion or nonlinear components and the signal component. The distortion includes any undesired signals added to or affecting adversely the input signal. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path with the distortion produced by the amplification process. In feed-forward amplifiers, the feed forward distortion reduction circuitry minimizes the pilot signal along with the distortion. As such, by designing the feed forward distortion reduction circuitry to detect and cancel the pilot signal, the distortion can also be removed.

The pilot signal is an electrical signal comprising at least one frequency component spectrally located near the frequency band of operation of the electrical circuit. A more complete description of the pilot signal is shown in FIG. 1 which shows the frequency response of a radio frequency (RF) amplifier including the location of the pilot signal. The pilot signal can be near the lower edge of the operating band (e.g., pilot 1) and/or located near the upper edge of the band of operation (e.g., pilot 2). The pilot is positioned a spectral distance of $\Delta f$ from an edge of the band of operation whose center frequency is $f_0$. The electrical characteristics (e.g., amplitude, phase response, spectral content) of the pilot signal are known.

The feed forward distortion reduction circuitry reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal, for example including at least one carrier signal, is applied to a splitter 14. The splitter 14 replicates the input signal on a main signal path 16 and a feed forward path 18. The splitter 14 is part of a carrier cancellation loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of the coupler 22 is applied to the amplifier 12 whose output comprises the amplified input signal, the amplified pilot signal and distortion signals produced by the amplifier 12.

A portion of the output of the amplifier 12 is obtained from the coupler 26 and is combined at the coupler 28 via coupling path 30 with a delayed version of the input signal on the feed forward path 18 to isolate the pilot signal with distortion on the feed forward path 18. The input signal on the feed forward path 18 is sufficiently delayed by delay circuit 24 so that such signal experiences the same delay as the signal appearing at the coupler 28 via the path 30. The resulting error signal contains the distortion produced by the amplifier 12 along with any portion of the carrier signal remaining at the output of the coupler 28 and the pilot signal. The amount of carrier cancellation in the carrier cancellation loop depends on the proper gain and out-of-phase relationship between the two paths from the splitter 14 to the coupler 28.

The gain & phase circuit 20 adjusts the phase and gain of the input signal according to control signals on control paths 32 and 33 such that the signal appearing at the coupler 28 via the path 30 is substantially the inverse (equal in amplitude but 180° out of phase) of the delayed input signal at the coupler 28. The gain and phase control signals appearing on the control paths 32 and 33 of the gain & phase circuit 20 are derived from the signal at the output of the coupler 28 in a well known manner by sampling the output of the coupler 28 with a coupler 34 and using signal detection and control circuitry 35. In general, the signal detection and control circuitry 35 detects an error signal for the carrier cancellation loop. The error signal represents the amplitude of the carrier signal(s) at point A. The signal detection and control circuitry 35 attempts to reduce the amplitude of the carrier signal(s) at point A by providing gain and/or phase control signals.

In this embodiment, the signal detection and control circuitry 35 includes a detector 36, such as a log detector, which produces a signal representing the amplitude of the carrier signal(s) at point A. A filter 38 filters the output of the log detector to produce a DC-type amplitude signal representing the amplitude of the carrier signal(s). The amplitude signal is provided to a nulling circuit 40. In response to the amplitude signal, the nulling circuit 40 provides the control signals on the control paths 32 and 33 to adjust the relative gain and/or phase between the combining signals at the coupler 28 and reduce the carrier signal(s). When the carrier signal(s) is minimized, the carrier signals combined at the coupler 28 substantially cancel each other leaving at the output of the coupler 28 the pilot signal with distortion produced by the amplifier 12. Loop #1 is thus a carrier cancellation loop which serves to isolate on the feed forward path 18 the pilot signal with distortion produced by the amplifier 12.

A distortion reduction loop or loop #2 attempts to reduce the pilot signal on the main signal path 16, thereby reducing the distortion produced by the amplifier 12, using the output of the coupler 28. The pilot signal with distortion on the feed forward path 18 is fed to a gain & phase circuit 42. The output of the gain and phase circuit 42 is fed to amplifier 44 whose output is applied to coupler 46. The coupler 46 combines the amplified pilot signal and distortion on the feed forward path 18 with the signals from the amplifier 12 on the main signal path 16 (carrier signal(s), pilot signal with distortion). A delay circuit 40 on the main signal path 16 delays the signals from the output of the amplifier 12 on the main signal path 16 to experience substantially the same delay as the corresponding signals from the output of the amplifier 12 which pass over the coupling path 30 through the coupler 28 to the coupler 46.

A coupler 48 provides an error signal representative of the signal at the output of the coupler 46 onto a pilot detection path 50. Because the frequency, amplitude and other electrical characteristics of the pilot signal are known, pilot detection and control circuitry 52 can detect the amplitude of the remaining portion of the pilot signal from the error signal on the pilot detection path 50. The pilot detection and control circuitry 52 determines the amplitude of the pilot signal, and in response to the amplitude of the remaining pilot signal, the pilot detection and control circuitry 52 provides control signals to the phase and gain circuit 42. In general, the pilot detection and control circuitry 52 will detect the pilot signal and use this information to generate control signals onto paths 66 and 68 to cause the gain & phase circuit 42 to adjust the gain and/or phase of the pilot signal on the feed forward path 18 such that the pilot signal on the main path 16 as well as the distortion is substantially the inverse (equal in amplitude but 180° out of phase) of the pilot signal and the distortion on the feed forward path 18 at the coupler 46. The corresponding pilot signals and distortion substantially cancel each other at the coupler 46 leaving the carrier signal(s) at the output of the system. Therefore, loop #2 is a distortion reduction loop which attempts to cancel the pilot signal to cancel substantially the distortion produced by the amplifier 12.

In this embodiment, the pilot detection and control circuitry 52 includes pilot receive circuitry 54 which includes a mixer 56 to frequency convert the error signal on the pilot detection path 50 to lower frequencies and a filter 58 to facilitate detection of the pilot signal by a signal detector 60. The detector 60, such as a log detector, produces a signal representing the amplitude of the signal at the output of the coupler 46. A filter 62 filters the output of the detector 60 to produce a DC-type amplitude signal representing the amplitude of the remaining pilot signal. The amplitude signal is provided to a nulling circuit 64. In response to the amplitude signal, the nulling circuit 64 provides gain and phase control signals on the control paths 66 and 68 to the phase and gain circuit 42. The control signals are provided to adjust the relative gain and/or phase between the pilot signals being combined at the coupler 46 to reduce the remaining pilot signal. The amount of cancellation of the pilot signal indicates the amount of distortion cancellation. When amplitude of the pilot signal is minimized, the pilot signals and distortion combined at the coupler 46 substantially cancel each other at the output of the coupler 46.

In actual systems, however, there is rarely an absolute cancellation of the distortion and the pilot signals. Feed forward distortion reduction systems require tight operating tolerances, for example to achieve a 30 dB reduction in IMDs, a typical feed forward correction system may have a frequency flat response (amplitude deviation over the frequency band of operation) as low as + or −0.1 dB and a phase linearity (phase deviation from a straight line in the frequency band of operation) as low as + or −1 degree.

The distortion of the input signal causes power to be generated in adjacent channels or frequencies to corrupt or to interfere with signals in the adjacent channels or frequencies, commonly referred to as spectral regrowth or adjacent channel power (ACP). The generation of adjacent channel power is of particular concern in wireless communications systems where the adjacent channel power of one channel can interfere with other channels or frequency bands. Wireless cellular communications systems comprise a number of base stations, geographically distributed to support transmission and receipt of communication signals to and from wireless units, which can be mobile or fixed, in the geographic region. Each base station handles voice and/or data communications over a particular region called a cell, and the overall coverage area for the cellular system is defined by the union of cells for all of the cell sites, where the coverage areas for nearby cell sites overlap to some degree to ensure (if possible) contiguous communications coverage within the outer boundaries of the system's coverage area.

In a wireless cellular communications system, a base station and a wireless unit communicate voice and/or data over a forward link and a reverse link, wherein the forward link carries communication signals from the base station to the wireless unit and the reverse link carries communication signals from the wireless unit to the base station. There are many different schemes for determining how wireless units and base stations communicate in a cellular communications system. Multi-user wireless communications systems, such as Code division multiple access (CDMA), wideband CDMA, Time division multiple access (TDMA), Global System for Mobile Communications (GSM) and orthogonal frequency division multiplexing (OFDM), multiple voice and/or traffic channels are combined into a single or multiple carriers. A linear amplifier should be able to react rapidly to transmit power changes and bursty traffic variations within the transient response specifications in the microsecond and millisecond ranges while providing adequate error cancellation.

In feed forward distortion reduction signals which use a pilot signal, the amplitude of the pilot signal is typically relatively small at the output of the feed forward distortion reduction system because of the cancellation of the pilot and the relative amplitude of the pilot signal is small with respect to the amplitude of the output signal. Thus, it becomes difficult to detect the pilot signal at the output of the system. To improve detection of the pilot signal at the output of the distortion reduction system, schemes are developed to generate the pilot signal at an appropriate location and to improve detection and control. Such schemes typically add costs to the systems.

Pilotless feed forward distortion reduction schemes have been developed to eliminate the pilot signal, thereby eliminating the need for the pilot generation, detection and control circuitry. The pilotless feed forward reduction systems, however, do not have a known pilot signal which can be more readily detected at the output of the feed forward distortion reduction system to compensate for changing operating conditions.

SUMMARY OF THE INVENTION

The present invention involves a distortion reduction system using upstream signal information, such as the carrier frequencies in a signal to be amplified, to determine at least one frequency for the distortion generated by an amplifier amplifying the signal. In response to the amplitude of the distortion at the at least one frequency, the distortion reduction system makes phase and/or amplitude adjustments to reduce the amplitude of the distortion. For example, processing circuitry obtains traffic frequencies making up a signal to be amplified by a feed forward amplifier arrangement. The feed forward amplifier arrangement receives the signal to be amplified on a main signal path and replicates the signal onto a main signal path and a feed forward path. The signal on the main signal path is applied to an amplifier whose output comprises the amplified signal and distortion signals produced by the amplifier. A replica of the output of the amplifier is placed on a coupling path and combined with a delayed version of the signal on the feed forward path to isolate a replica of the distortion on the feed forward path. The distortion of the feed forward path is applied to a gain and/or phase circuit to adjust the amplitude and/or phase of the distortion, and the distortion on the feed forward path is combined with the amplified signal and the distortion on the main signal path to output the amplified signal with reduced distortion. Using at least one frequency component making up the signal, at least one frequency for the distortion generated by the amplifier is determined. A sample of the output is taken, and distortion detection circuitry is used to detect the amplitude of the distortion at the at least one frequency. In response to the amplitude of the distortion at the at least one frequency, the processing circuitry provides gain and/or phase control signal(s) to adjust the relative phase and/or gain between the combining distortion products to reduce the amplitude of the distortion.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
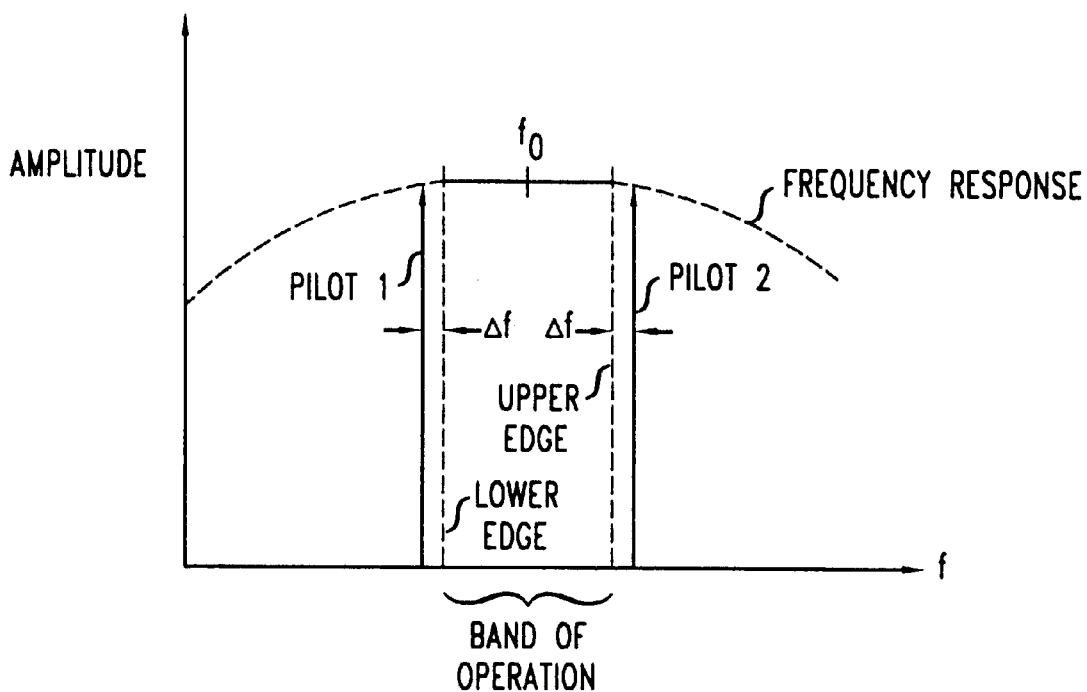
FIG. 1 shows an example frequency response curve of an RF amplifier showing frequency within which the amplifier is operating.
Figure 2:
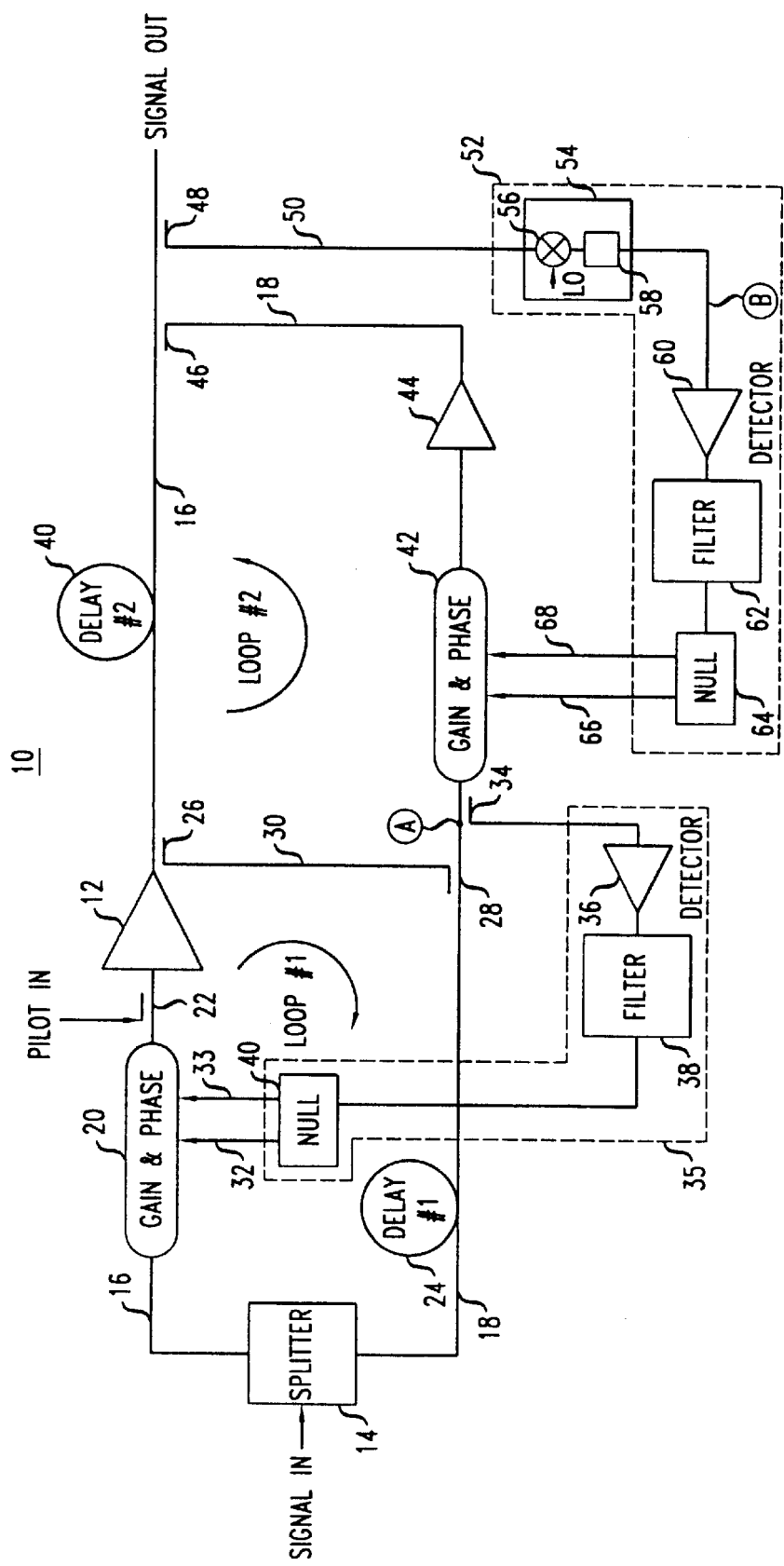
FIG. 2 is a block diagram of a feed forward distortion reduction system used for RF amplifiers.
Figure 3:
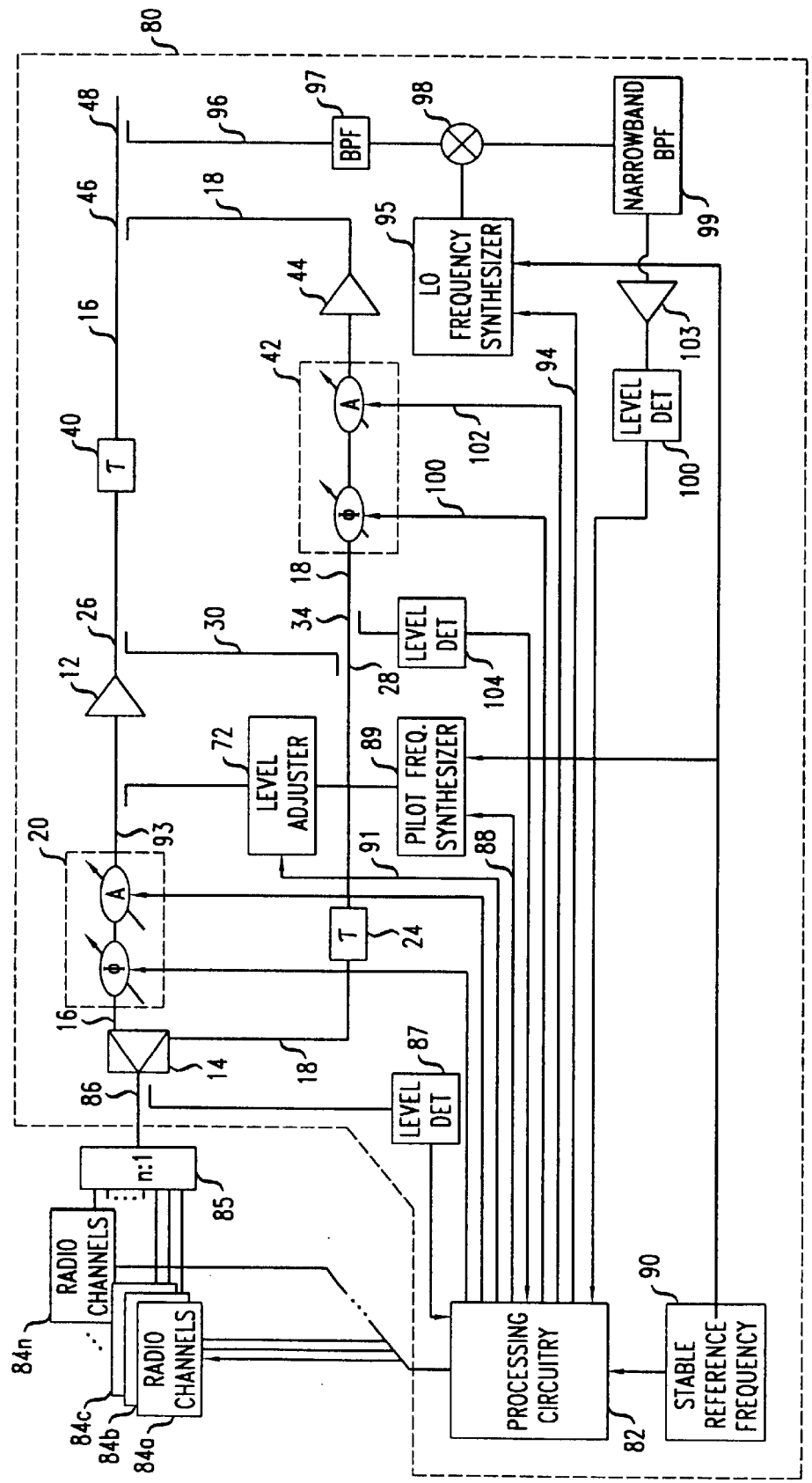
FIGS. 3–6 shows embodiments of a feed forward amplifier distortion reduction system according to the principles of the present invention.

An illustrative embodiment of a system and method for producing an amplified signal with reduced distortion according to the principles of the present invention is described below in a feed forward amplifier distortion reduction system. FIG. 3 shows a general block diagram of a feed forward amplifier architecture 80 in which like reference numerals indicate components corresponding to the components of the feed forward amplifier architecture 10 of FIG. 2. In the feed forward amplifier architecture 80, processing circuitry 82 determines the radio channels 84a–n or frequencies to be used, for example in communications between a base station and wireless units. A combiner 86 combines the n radio channels to produce a signal to be amplified by the feed forward amplifier arrangement 80. The feed forward amplifier arrangement 80 receives the signal to be amplified, and a splitter 14 replicates the signal onto a main signal path 16 and a feed forward path 18. The signal on the main signal path 16 is applied to a phase and gain circuit 20, and the output of the phase and gain circuit 20 is applied to an amplifier 12 whose output comprises the amplified signal and distortion signals produced by the amplifier 12. A replica of the output of the amplifier 12 is placed on a coupling path 30 and combined with a delayed version of the signal on the feed forward path 18 to isolate a replica of the distortion on the feed forward path 18.

The distortion of the feed forward path 18 is applied to a gain and/or phase circuit 42 to adjust the amplitude and/or phase of the distortion, and the distortion on the feed forward path 18 is combined with the amplified signal and the distortion on the main signal path 16 to output the amplified signal with reduced distortion. Using, depending on, based on, and/or as a function of a frequency or frequencies of radio channel(s) making up the signal, the processing circuitry 82 can determine at least one distortion frequency $F_D$ for the distortion generated by the amplifier 12. After the at least one frequency for the distortion is identified, the processing circuitry 82 can select the at least one distortion frequency for detection.

In this embodiment, the processing circuitry 82 provides a tuning signal 87 to at least one local oscillator (LO) 88 which selects the frequency $F_{LO}$ of at least one local oscillator (LO) 88. In this embodiment, the processing circuitry and the LO 88 receive a reference frequency signal from a stable reference frequency generator 89. The selected frequency of the least one LO 88 is used to frequency convert the at least one distortion frequency to facilitate detection of the distortion frequency. For example, a coupler 48 samples the amplified signal with reduced distortion after the coupler 46 to provide a replica of the amplified signal and distortion on a distortion detection path 90. After being filtered by a band-pass filter 92, the signal remaining on the distortion detection path 90 is provided to a mixer 94 to mix the distortion with the frequency from the LO 88. As such, the distortion is frequency converted to a frequency $F_I$, for example to a lower frequency, where a band pass filter 96, such as a narrow band pass filter, passes the converted distortion frequency while rejecting other frequencies. The bandpass filter 96 has a center frequency equal to $F_I$ which is equal to $F_{LO}-F_D$ or $F_D-F_{LO}$ and a bandwidth (BW) which can vary depending on the desired performance and/or application. For example, the BW can vary depending on the carrier BW, such as about 30 KHz for TDMA, about 200 KHz for wideband TDMA, about 1.225 MHz for CDMA, about 4.05 MHz for wideband CDMA and about 200 KHz for Global System for Mobile Communications (GSM).

An amplifier 97 amplifies the output of the bandpass filter 96, and a signal detector 98 receives the output of the bandpass filter 96 with the distortion and produces a signal representing the amplitude of the distortion at the at least one determined and/or selected frequency to the processing circuitry 82. In response to the amplitude of the distortion at the at least one frequency, the processing circuitry 82 provides gain and/or phase control signal(s) 100 and/or 102 to gain and/or phase circuit 42. The control signals are provided to adjust the relative gain and/or phase between the distortion products being combined at the coupler 46 to reduce the distortion in the frequency band of operation on the main signal path 16. When the amplitude of the distortion at the at least one frequency is minimized, the distortion in the frequency band of operation on the feed forward path 18 and the main signal path 16 substantially cancel each other at the output of the coupler 46. As such, the processing circuitry 82 is adjusting the relative phase and/or gain between the distortion products from the main signal path 16 and the feed forward path 18 such that the distortion products combine at the output to the coupler 46 with a phase difference of about 180 degrees and equal amplitudes.

To improve the isolation of the distortion on the feed forward path 18, a coupler 34 samples the output to the coupler 28, and signal detection circuitry 104 provides a signal to the processing circuitry 82 that represents the amplitude of the signal at the output to the coupler 28. In response to the signal from the detection circuitry 104, the processing circuitry 82 provides gain and/or phase control signal(s) 106 and/or 108 to gain and/or phase circuit 20. The control signals are provided to adjust the relative gain and/or phase between the signals being combined at the coupler 28 to improve the cancellation of the signal components. As such, the processing circuitry 82 is adjusting the relative phase and/or amplitude between the signal components from the main signal path 16 and the feed forward path 18 such that the signal components combine at the output to the coupler 28 with a phase difference of about 180 degrees and equal amplitudes.

Figure 4:
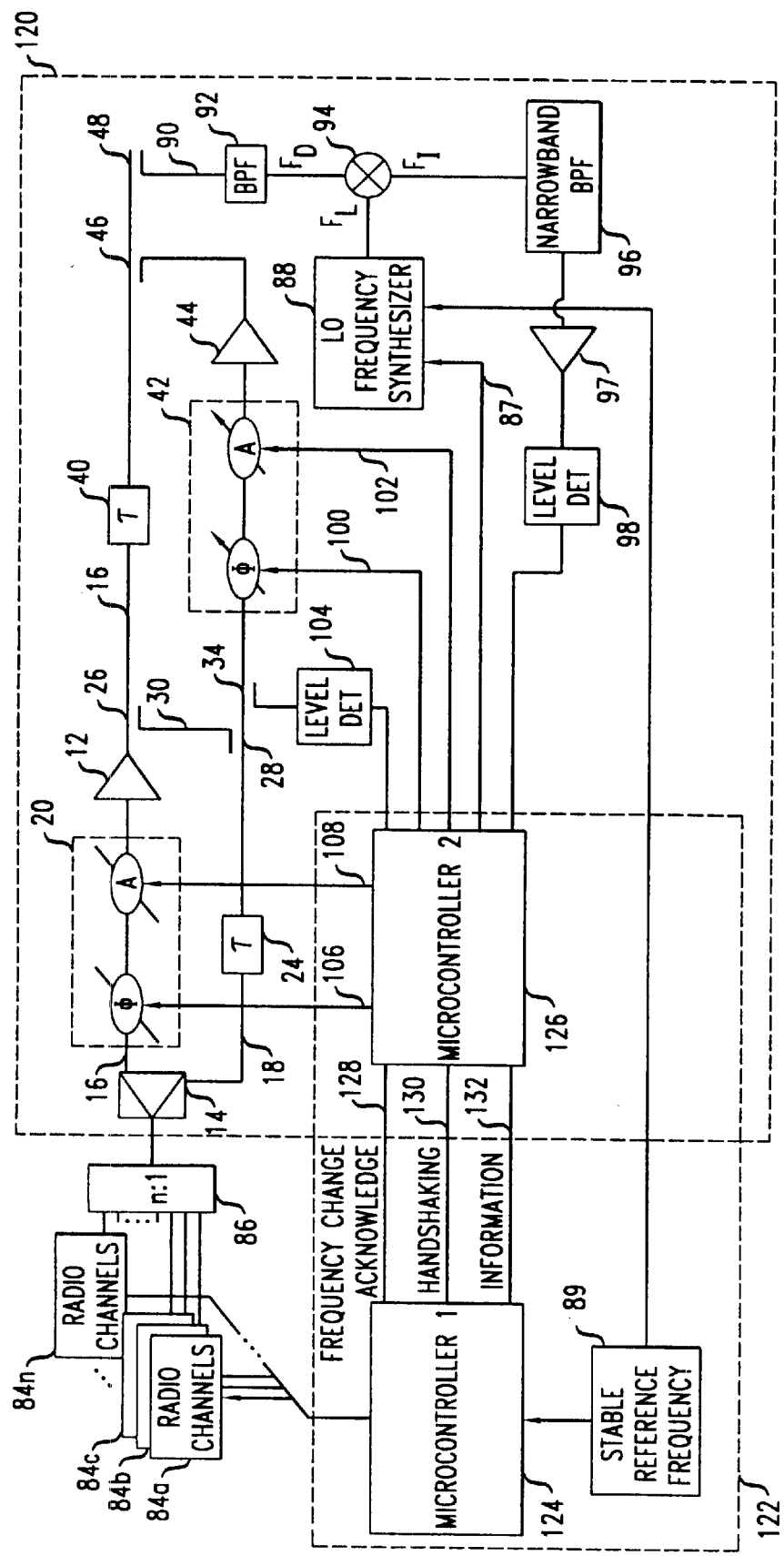

FIG. 4 shows an alternative implementation of a feed forward amplifier architecture 120 in which like reference numerals indicate components corresponding to the components of the feed forward amplifier architectures above. In the feed forward amplifier architecture 120, processing circuitry 122 includes a channel frequency controller 124, such as a digital signal processor (DSP), a microcontroller or other processing circuitry, for assigning radio channels 84*a–n*, coupled to a stand-alone feed forward controller 126, such as a second DSP, microcontroller or other processing circuitry, for controlling the feed forward amplifier architecture 120. In operation, the channel frequency controller 124 assigns the radio channel frequencies 84*a–n* which are combined and amplified to be used in communications. The channel frequency controller 124 informs the feed forward controller 126 of the channel frequency or frequencies from which the feed forward controller 126 determines the intermodulation distortion product(s) (IMDs). In this embodiment, the channel frequency controller 124 acknowledges the feed forward controller 126 of a change in the radio frequencies with a frequency change acknowledgment 128. The feed forward controller 126 receives the interrupt 128 and sends a handshake signal 130 to the channel frequency controller 124. After which, the feed forward controller 126 receives the new channel frequency information 132 from the channel frequency controller 124. With the new channel frequency information, the feed forward controller 126 determines the at least one frequency at which distortion is to be detected and the gain and/or phase adjustments made in response to the amplitude of the distortion at the at least one determined frequency.

Figure 5:
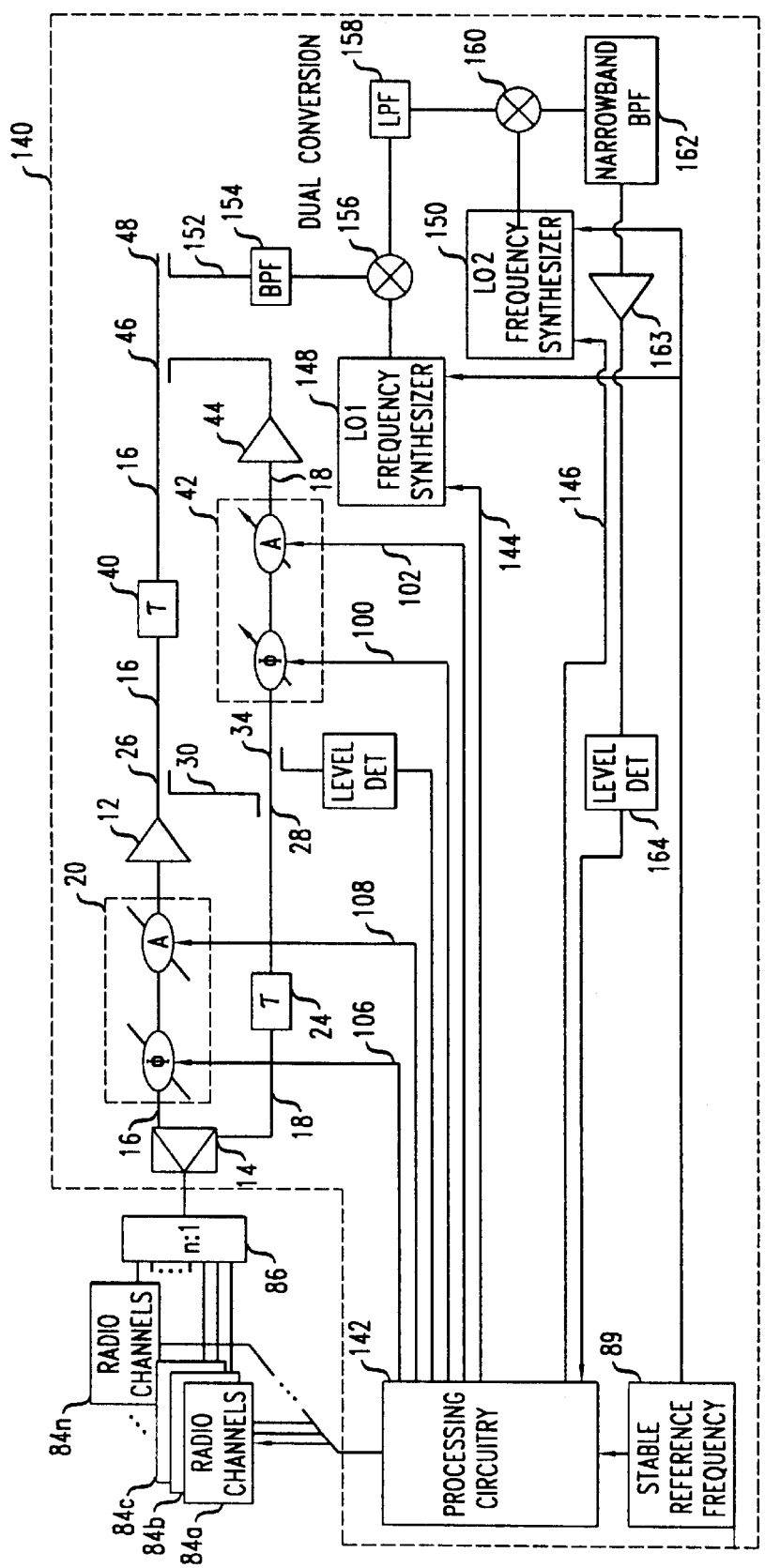

FIG. 5 shows an alternative implementation of a feed forward amplifier architecture 140 in which like reference numerals indicate components corresponding to the components of the feed forward amplifier architectures above. In the feed forward amplifier architecture 140, processing circuitry 142, such as a digital signal processor (DSP) or microcontroller, can determine at least one frequency $F_D$ for the distortion generated by the amplifier 12 using, based on, depending on or as a function of a frequency or frequencies of radio channel(s) making up the signal. After the at least one frequency for the distortion is identified, the processing circuitry 142 can select the at least one distortion frequency for detection. In this embodiment, the processing circuitry 142 provides tuning signals 144 and 146 to a first local oscillator (LO) 148 and a second local oscillator (LO) 150, respectively, to select respective frequencies $F_{LO1}$ and $F_{LO2}$. The selected frequencies LO1 and LO2 are used to perform a dual frequency conversion of the at least one distortion frequency to facilitate detection of the distortion frequency using local oscillator frequencies which are outside the frequency band of the radio channel frequencies. In the single conversion implementations above, the LO frequency may be in the frequency band of the radio frequency channels.

For example, a coupler 48 samples the amplified signal with reduced distortion after the coupler 46 to provide a replica of the amplified signal and distortion on a distortion detection path 152. After being filtered by a band-pass filter 154, the signal and distortion remaining on the distortion detection path 152 is provided to a first mixer 156 to mix the signal and distortion remaining on the distortion detection path 152 with the frequency signal from the first LO 148. The first mixer 156 performs a first frequency conversion of the distortion to a first intermediate frequency $F_{I1}$, for example to a lower frequency, where a low pass filter 158 passes the converted distortion frequency while rejecting higher frequencies. The converted distortion signal (and any remaining signals) is provided to a second mixer 160 to mix the distortion (and any remaining signals) with the frequency signal from the second LO 150. The second mixer 160 performs a second frequency conversion of the converted amplified signal and frequency distortion to a second intermediate frequency $F_{I2}$, for example to an even lower frequency, where a narrowband bandpass filter 162 passes the twice converted distortion frequency while rejecting the other frequencies. The bandpass filter 162 can have a center frequency equal to $F_{I2}$ which is equal to $F_{LO1}-F_D-F_{LO2}$, $F_D-F_{LO1}-F_{LO2}$, $F_{LO2}-F_{LO1}+F_D$ or $F_{LO2}-F_D+F_{LO1}$ and a bandwidth (BW) which can vary depending on the desired performance and/or application. For example, the BW can vary depending on the carrier BW, such as about 30 KHz for TDMA, about 200 KHz for wideband TDMA, about 1.225 MHz for CDMA, about 4.05 MHz for wideband CDMA and about 200 KHz for Global System for Mobile Communications (GSM).

An amplifier 163 amplifies the output of the bandpass filter 162, and a signal detector 164 receives the output of the narrowband filter 162 with the distortion and produces a signal representing the amplitude of the distortion at the at least one frequency to the processing circuitry 142. In response to the amplitude of the distortion at the at least one frequency, the processing circuitry 142 provides gain and/or phase control signal(s) 100 and/or 102 to gain and/or phase circuit 42. The control signals are provided to adjust the relative gain and/or phase between the distortion being combined at the coupler 46 to reduce the distortion in the frequency band of operation on the main signal path 16. When amplitude of the distortion at the at least one frequency is minimized, the distortion across the frequency band of operation on the feed forward path 18 and the main signal path 16 substantially cancel each other at the output of the coupler 46. As such, the processing circuitry 142 is adjusting the relative phase and/or gain between the distortion products from the main signal path 16 and the feed forward path 18 such that the distortion products combine at the output to the coupler 46 with a phase difference of about 180 degrees and equal amplitudes.

Figure 6:
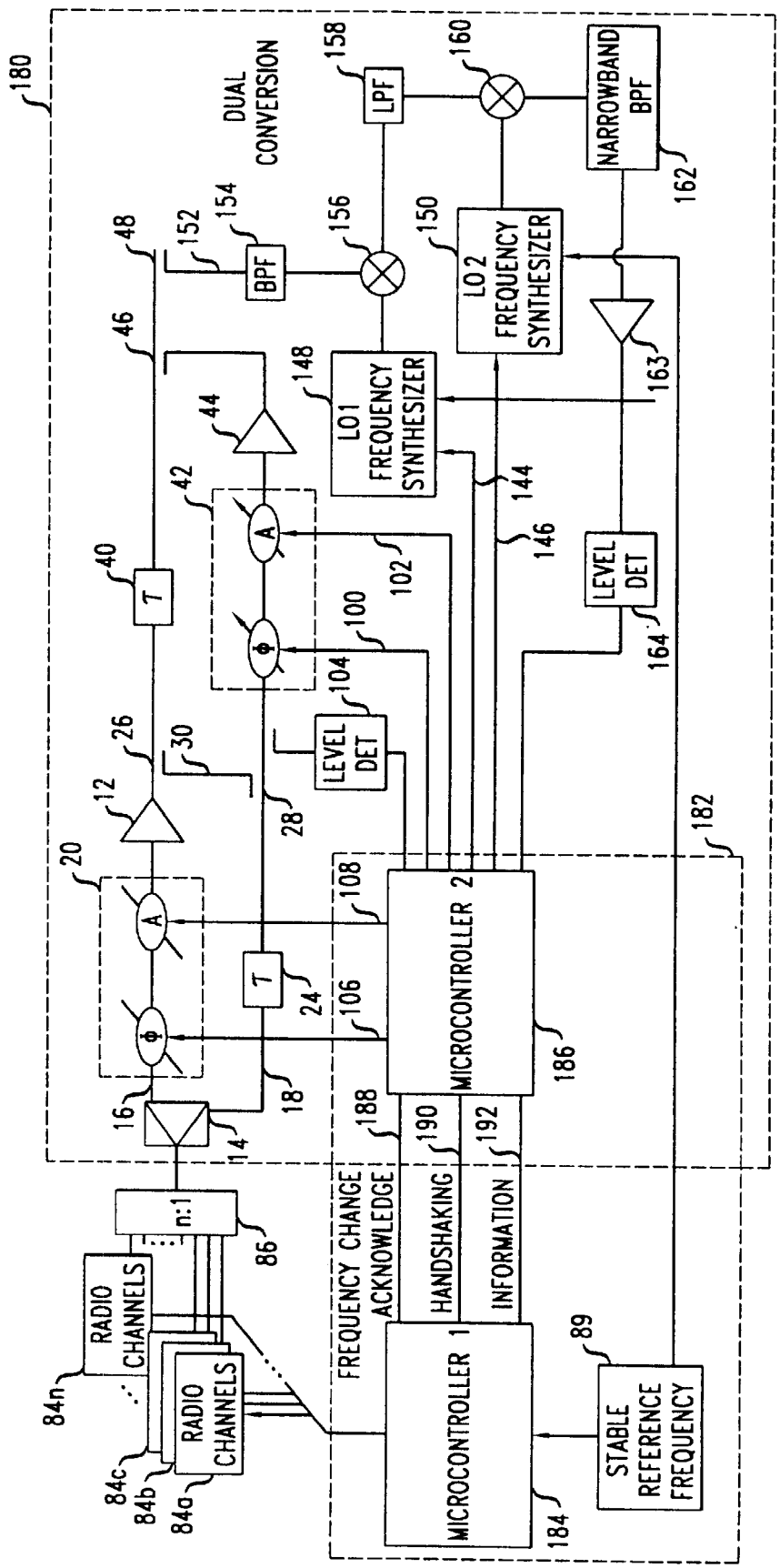

In addition to the embodiments described above, alternative configurations of the feed forward amplifier system according to the principles of the present invention are possible which use variations or portions of the above described system. For example, FIG. 6 shows an alternative implementation of a feed forward amplifier architecture 180 in which like reference numerals indicate components corresponding to the components of the feed forward amplifier architectures above. In the feed forward amplifier architecture 180, processing circuitry 182 includes a channel frequency controller 184, such as a digital signal processor (DSP) or a microcontroller, for assigning radio channels 84*a–n* coupled to a stand-alone feed forward controller 186, such as a second DSP or microcontroller, for controlling the feed forward amplifier architecture 180. Additionally, the distortion signal at the output of the feed forward amplifier system 180 is detected by performing a dual frequency conversion of the distortion signal as described above for FIG. 5.

In operation, the channel frequency controller 184 assigns the radio channel frequencies 84*a–n* to be used in communications after being combined and amplified. The channel frequency controller 184 informs the feed forward controller 186 of the channel frequencies from which the feed forward controller 186 determines the intermodulation distortion product(s) (IMDs) and provides control signal(s) to enable detection of the distortion at the at least one frequency. In this embodiment, the channel frequency controller 184 acknowledges the feed forward controller of a change in the radio frequencies with a frequency change acknowledgment 188. The feed forward controller 186 receives the interrupt 188 and sends a handshake signal 190 to the channel frequency controller 184. After which, the feed forward controller 186 receives the new frequency channel information 192 from the channel frequency controller 184.

The feed forward controller 186 determines at least one frequency $F_D$ for the distortion generated by the amplifier 12 based on, using, depending on and/or as a function of the frequency or frequencies of radio channel(s) making up the signal. After the at least one frequency for the distortion is identified, the feed forward controller 186 can select the at least one distortion frequency for detection. In this embodiment, the feed forward controller 186 provides tuning signals 144 and 146 to a first local oscillator (LO) 148 and a second local oscillator (LO) 150, respectively, to select respective frequencies $F_{LO1}$ and $F_{LO2}$. The selected frequencies LO1 and LO2 are used to perform the dual frequency conversion of the at least one distortion frequency to facilitate detection of the distortion frequency. In response to the amplitude of the distortion, the feed forward controller 186 provides phase and/or gain signals 100 and/or 102 to phase and gain circuit 42 to reduce the amplitude of the distortion at the output.

Figure 7:
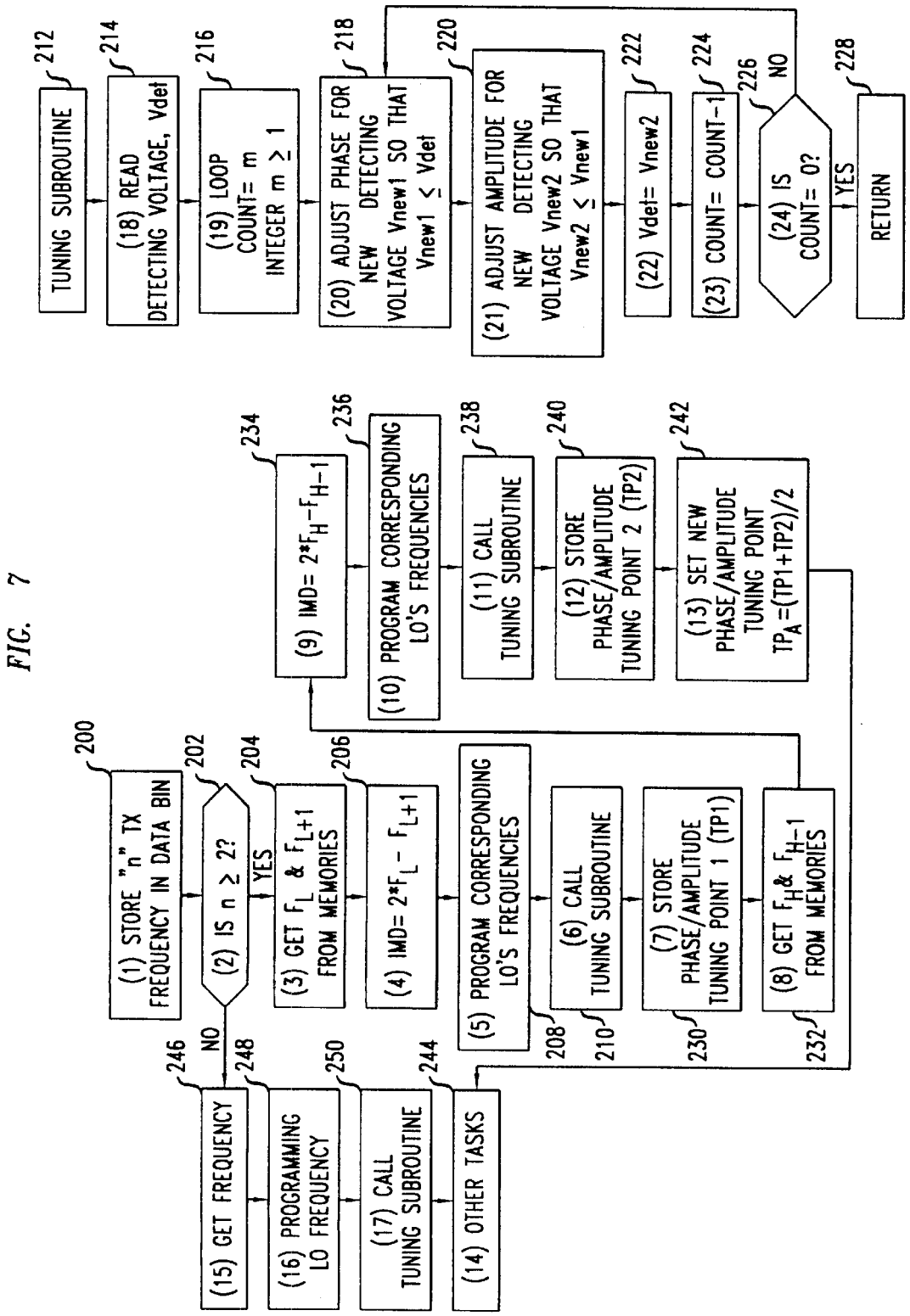
FIG. 7 shows a flow diagram describing how an embodiment of the feed forward amplifier distortion reduction system operates according to principles of the present invention.

FIG. 7 shows a flow diagram describing how an embodiment of the feed forward amplifier system operates to provide phase and/or amplitude adjustments in response to the amplitude of the at least one distortion signal. Embodiments of the flow diagram can operate in the processing circuitry 82 (FIG. 3), 122 (FIG. 4), 142 (FIG. 5) and 182 (FIG. 6) above or portions thereof. In block 200, the n transmit frequencies or radio channels are stored in a memory. In an implementation using a stand-alone feed forward controller 126 (FIG. 4) or 186 (FIG. 6), the feed forward controller receives the n radio frequencies from the channel frequency controller 124 (FIG. 4) or 184 (FIG. 6). At block 202, a decision is made as to whether the number n of radio frequency channels is greater than or equal to 2.

If the number of radio frequency channels is greater than or equal to 2, the processing circuitry obtains the lowest frequency channel $F_L$ and the second lowest frequency channel $F_{L+1}$ from memory at block 204. The processing circuitry determines a first distortion frequency or an intermodulation distortion product IMD1=$2*F_L-F_{L+1}$ at block 206. The processing circuitry determines the appropriate frequency value(s) for the corresponding LO(s) and programs the LOs at block 208 such that the first distortion frequency is converted to fall within the center frequency of the narrowband bandpass filter for detection by the detection circuitry.

At block 210, the processing circuitry proceeds to a tuning subroutine 212 where the relative amplitude and phase is adjusted between the combining distortion signals to obtain gain and phase values producing a reduced distortion. For example, at block 214, the amplitude of the distortion at the at least one frequency is detected at the output as represented by a voltage value $V_{det}$. A repetitive loop is established at block 216 where count=m to 1. In the loop at block 218, the processing circuitry provides phase control signals to a variable phase shifter to adjust the relative phase between the distortion frequencies combining at the coupler 46. The relative phase for the distortion products is adjusted so the resulting amplitude level of the distortion at the at least one frequency at the output $V_{new1}<V_{det}$. At block 220, the processing circuitry provides amplitude or gain control signals to a variable attenuator to adjust the relative amplitude between the distortion frequencies combining at the coupler 46. The amplitude for the distortion is adjusted so the resulting amplitude level of the distortion at the at least one frequency at the output $V_{new2}<=V_{new1}$. The detected distortion amplitude level variable $V_{det}$ is set to the value $V_{new2}$ at block 222, and the loop counter COUNT is decremented by one at block 224. If the counter COUNT=0 as determined at block 226, the processing circuitry returns at block 228 to the block which called the tuning subroutine. Otherwise, the processing circuitry loops back up to the block 218.

When the tuning subroutine returns from being called at the first tuning point (TP1) of block 210, the processing circuitry stores the phase and amplitude adjustment values at block 230 for the first distortion frequency IMD1.

At block 232, the processing circuitry retrieves the highest channel frequency $F_H$ and the next highest channel frequency $F_{H-1}$. The processing circuitry then determines a second distortion frequency IMD2=$2*F_H-F_{H-1}$ at block 234. The processing circuitry determines the appropriate frequency value(s) for the corresponding LO(s) and programs the LOs at block 236 such that the second distortion frequency is converted to fall within the center frequency of the narrowband bandpass filter for detection by the detection circuitry. At block 238, the processing circuitry calls or proceeds to the tuning subroutine (block 212) for the second tuning point (TP2) associated with the second distortion frequency. As described above for the first tuning point (TP1), the processing circuitry returns from the tuning subroutine with amplitude and phase adjustment values of the second tuning point which are stored at block 240. As such, the processing circuitry has tuning points which provide reduced amplitude for the first distortion frequency associated with the lowest channel frequency pair and for the second distortion frequency associated with the highest channel frequency pair. To provide overall improved performance, this embodiment of the processing circuitry averages the phase and amplitude adjustment values for the tuning points TP1 and TP2 to provide the new tuning point TP=(TP1+TP2)/2 at block 242. After, the processing circuitry can proceed to block 244 to perform other tasks and/or wait for a change in the radio frequency channels.

If at block 202 the number n of radio channel frequencies is equal to one, the radio channel frequency $F_{TX}$ is retrieved at block 246. Depending on the channel frequency, the processing circuitry determines at least one distortion frequency to detect. The processing circuitry programs the LO to an appropriate frequency at block 248. For example, in the single conversion implementations of FIGS. 3 and 4, the LO=$(F_{TX} \pm F_I) \pm$conducted spurious emission offset frequency, where the conducted spurious emission offset frequency is signal dependent, for example about 30 KHz for TDMA, about 1.2288 MHz for CDMA, about 5 MHz for wideband CDMA and about 200 KHz for GSM. As such, the processing circuitry determines the appropriate LO frequency or frequencies and programs the LO(s) with the appropriate frequency or frequencies at block 248 such that the adjacent channel power product can be detected to provide the gain and/or phase control signals at block 250 using the tuning subroutine described above at block 212. The tuning subroutine provides the phase and/or amplitude adjustments in response to the amplitude of the distortion at the at least one frequency at the output of the coupler 46.

In addition to the embodiment described above, alternative configurations of the amplifier distortion reduction system according to the principles of the present invention are possible which omit and/or add components and/or use variations or portions of the described system. For example, the above embodiments are described in a feed forward amplifier arrangement, but other embodiments are possible which provide relative gain and/or phase adjustments between combining distortion components based on and/or using the amplitude of the detected distortion component which is at a frequency determined by, based on, depending on and/or a function of radio frequency channel(s) being amplified. Depending on the application, the gain and/or phase circuitry can be positioned in different locations and/or paths within the feed forward amplifier arrangement. For example the gain and phase adjustment circuit 20 could be located on the path 18 before the coupler 28; the gain and phase adjuster 42 could be located on the path 16 after the coupler 26; or the gain and phase adjustment circuitry 20 and 42 could be located at both locations. The control system has been described as using a software driven processing circuitry with analog and digital conversion, but other configurations can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing an amplified signal with reduced distortion, said method comprising:

determining using upstream signal information at least one frequency for the distortion generated by an amplifier amplifying a signal that is obtained by determining n radio channel frequencies to be used in communications and combining n radio channels to produce a signal to be amplified;

detecting an amplitude of the distortion at said at least one frequency; and providing gain and/or phase adjustments between combining distortion products based on said amplitude of said distortion at said at least one frequency to reduce the amplitude of the distortion in a frequency band of operation.

2. The method of claim 1 includes:

splitting a signal to be amplified onto a main signal path and a feed forward path;

amplifying said signal on said main signal path to produce an amplified signal with distortion on said main signal path;

sampling said amplified signal with said distortion to obtain a replica of said amplified signal with said distortion on a coupling path;

combining said signal on said feed forward path with said replica of said amplified signal and said distortion on said coupling path to produce said distortion on said feed forward path;

applying said distortion on said feed forward path to a gain and/or phase circuit to adjust the amplitude and/or phase of the distortion on said feed forward path;

combining said distortion on said feed forward path with said amplified signal and said distortion on said main signal path to output the amplified signal with reduced distortion;

wherein said detecting includes detecting said amplitude of said distortion on said main signal path after said combining; and wherein said providing includes providing gain and/or phase adjustments at said applying based on said amplitude of said distortion at said at least one frequency.

3. The method of claim 2 and further comprising the step of amplifying said distortion on said feed forward path.

4. The method of claim 2 wherein said detecting includes:

obtaining a replica of said distortion on a distortion detection path;

frequency converting said distortion on said distortion detection path;

filtering after frequency converting said distortion on said distortion detection path to attenuate said amplified signal while retaining said distortion; and detecting the amplitude of said distortion.

5. The method of claim 4 wherein said detecting includes:

tuning at least one local oscillator (LO) to at least one LO frequency;

mixing said amplified signal and said distortion with said at least one LO frequency to produce said distortion at an intermediate frequency; and filtering said distortion using a bandpass having said intermediate frequency as said center frequency of said bandpass filter.

6. The method of claim 5 wherein said detecting includes:

tuning a first local oscillator (LO) to a first LO frequency and a second LO to a second LO frequency;

mixing said amplified signal and said distortion with said first LO frequency to produce said distortion at a first intermediate frequency; and mixing said distortion at said first intermediate frequency with said second LO frequency to produce said distortion at a second intermediate frequency; and filtering said distortion using a bandpass having said second intermediate frequency as said center frequency of said bandpass filter.

7. A distortion reduction system comprising:

processing circuitry configured to receive upstream signal information and to determine n radio channel frequencies to be used in communications and combine n radio channels to produce a signal to be amplified and operative for determining at least one frequency for the distortion generated by an amplifier amplifying the signal;

distortion detection circuitry coupled to said processing circuitry and configured to receive said distortion at said at least one frequency, said signal detection circuitry producing to said processing circuitry a distortion amplitude signal representing an amplitude for said distortion circuitry at said at least one frequency; and said processing circuitry providing gain and/or phase adjustments between combining distortion products based on said distortion amplitude signal to reduce the amplitude of the distortion.

8. The system of claim 7 includes:
a first splitter receives a signal to be amplified and provides a replica of said signal onto a main signal path and a feed forward path;
a first amplifier on said main signal path amplifies said signal on said main signal path to produce an amplified signal with distortion on said main signal path;
a first coupler couples a replica of said amplified signal with said distortion onto a coupling path;
a second coupler combines said signal on said feed forward path with said replica of said amplified signal and said distortion on said coupling path to produce said distortion on said feed forward path;
a gain and/or phase circuit on said feed forward path receives said distortion to adjust the amplitude and/or phase of the distortion on said feed forward path;
a third coupler combines said distortion on said feed forward path with said amplified signal and said distortion on said main signal path to output the amplified signal with reduced distortion;
said distortion detection circuitry receives said amplified signal with said distortion and detects said amplitude of said distortion on said main signal path after said third coupler; and
said processing circuitry providing gain and/or phase adjustments based on said amplitude of said distortion at said at least one frequency.

9. The system of claim 8 including a second amplifier on said feed forward path amplifies said distortion on said feed forward path.

10. The system of claim 8 wherein said distortion detection circuitry includes:
a fourth coupler receives said amplified signal and said distortion and copuples a replica of said amplified signal with said distortion onto a distortion detection path;
frequency conversion circuitry converts said distortion on said distortion detection path to an intermediate frequency;
a band pass filter having a center frequency at said intermediate frequency attenuates said amplified signal while retaining said distortion; and
detection circuitry produces said distortion amplitude signal in response to said distortion at said intermediate frequency.

11. The system of claim 10 wherein said distortion detection circuitry includes:
at least one local oscillator (LO) tuned to at least one LO frequency in response to said processing circuitry; and
at least one mixer mixes said amplified signal and said distortion with said at least one LO frequency to produce said distortion at said intermediate frequency.

12. The system of claim 11 wherein said distortion detection circuitry includes:
a first local oscillator (LO) tuned to a first LO frequency in response to said processing circuitry;
a first mixer receives said amplified signal with said distortion on said distortion detection path and mixes said amplified signal with said distortion with said first LO frequency to produce said amplified signal and said distortion at a first intermediate signal;
a second LO tuned to a second LO frequency in response to said processing circuitry;
a second mixer receives said amplified signal with said distortion at said first intermediate frequency and mixes said amplified signal with said distortion with said second LO frequency to produce said amplified signal and said distortion at a second intermediate frequency; and
said bandpass having said second intermediate frequency as said center frequency of said bandpass filter.

* * * * *